US012622204B2

(12) United States Patent
Kanarik et al.

(10) Patent No.: US 12,622,204 B2
(45) Date of Patent: *May 5, 2026

(54) PLASMA ETCHING CHEMISTRIES OF HIGH ASPECT RATIO FEATURES IN DIELECTRICS

(71) Applicant: Lam Research Corporation, Fremont, CA (US)

(72) Inventors: Keren J. Kanarik, Los Altos, CA (US); Samantha SiamHwa Tan, Newark, CA (US); Yang Pan, Los Altos, CA (US); Jeffrey Marks, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/431,669

(22) Filed: Feb. 2, 2024

(65) Prior Publication Data

US 2024/0178014 A1 May 30, 2024

Related U.S. Application Data

(63) Continuation of application No. 18/163,522, filed on Feb. 2, 2023, now Pat. No. 12,119,243, which is a continuation of application No. 16/979,372, filed as application No. PCT/US2019/021761 on Mar. 12, 2019, now Pat. No. 11,594,429.

(60) Provisional application No. 62/644,095, filed on Mar. 16, 2018.

(51) Int. Cl.
*H01L 21/67* (2006.01)
*H01L 21/683* (2006.01)

(52) U.S. Cl.
CPC .. *H01L 21/67069* (2013.01); *H01L 21/67109* (2013.01); *H01L 21/6833* (2013.01)

(58) Field of Classification Search
None
See application file for complete search history.

(56) References Cited

U.S. PATENT DOCUMENTS

| | | | |
|---|---|---|---|
| 4,943,344 | A | 7/1990 | Tachi et al. |
| 5,147,500 | A | 9/1992 | Tachi et al. |
| 5,643,473 | A | 7/1997 | Tachi |
| 7,494,934 | B2 | 2/2009 | Bai |

(Continued)

FOREIGN PATENT DOCUMENTS

| | | |
|---|---|---|
| CN | 1956154 | 5/2007 |
| JP | 1-103837 | 4/1989 |

(Continued)

OTHER PUBLICATIONS

Office Action from U.S. Appl. No. 16/979,372 dated Aug. 10, 2021.

(Continued)

*Primary Examiner* — Roberts P Culbert
(74) *Attorney, Agent, or Firm* — Beyer Law Group LLP

(57) ABSTRACT

A method for etching features in a stack below a patterned mask in an etch chamber is provided. The stack is cooled with a coolant with a coolant temperature below −20° C. An etch gas is flowed into the etch chamber. A plasma is generated from the etch gas. Features are selectively etched into the stack with respect to the patterned mask.

20 Claims, 4 Drawing Sheets

(56) References Cited

U.S. PATENT DOCUMENTS

| | | | |
|---|---|---|---|
| 9,595,452 | B2 | 3/2017 | Hsu et al. |
| 9,728,422 | B2 | 8/2017 | Oomori et al. |
| 9,892,932 | B2 | 2/2018 | Shen et al. |
| 9,991,128 | B2 | 6/2018 | Tan et al. |
| 10,115,600 | B2 | 10/2018 | Gupta et al. |
| 10,192,751 | B2 | 1/2019 | Yang et al. |
| 10,361,092 | B1 | 7/2019 | Roberts et al. |
| 10,490,415 | B2 | 11/2019 | Imamura et al. |
| 10,600,654 | B2 | 3/2020 | Tomura et al. |
| 10,692,729 | B2 | 6/2020 | Kudo et al. |
| 10,720,335 | B2 | 7/2020 | Shen et al. |
| 11,152,223 | B2 | 10/2021 | Anderson et al. |
| 11,365,476 | B2 | 6/2022 | Jha et al. |
| 12,119,243 | B2 | 10/2024 | Kanarik et al. |
| 2007/0048954 | A1 | 3/2007 | Kato et al. |
| 2007/0082483 | A1 | 4/2007 | Bai |
| 2007/0232070 | A1 | 10/2007 | Wege et al. |
| 2014/0206196 | A1 | 7/2014 | Umezaki et al. |
| 2016/0056050 | A1 | 2/2016 | Kong et al. |
| 2016/0293609 | A1* | 10/2016 | Jha .................... C23C 16/45523 |
| 2016/0307764 | A1 | 10/2016 | Gupta et al. |
| 2017/0263611 | A1 | 9/2017 | Imamura et al. |
| 2017/0358460 | A1 | 12/2017 | Tomura et al. |
| 2018/0182777 | A1 | 6/2018 | Cui et al. |
| 2018/0204728 | A1 | 7/2018 | Oomori et al. |
| 2018/0226264 | A1 | 8/2018 | Takayama et al. |
| 2018/0233325 | A1 | 8/2018 | Kanarik et al. |
| 2019/0206723 | A1 | 7/2019 | Tokashiki et al. |
| 2021/0005472 | A1 | 1/2021 | Kanarik et al. |
| 2022/0059361 | A1 | 2/2022 | Nakaya et al. |
| 2023/0187234 | A1 | 6/2023 | Kanarik et al. |
| 2024/0203759 | A1 | 6/2024 | Kanarik et al. |
| 2024/0203760 | A1 | 6/2024 | Kanarik et al. |

FOREIGN PATENT DOCUMENTS

| | | |
|---|---|---|
| JP | H06-326060 | 11/1994 |
| JP | 10-242130 | 9/1998 |
| JP | 2007/110112 | 4/2007 |
| JP | 2007-141918 | 6/2007 |
| JP | 2012-227440 | 11/2012 |
| JP | 2016-529740 | 9/2016 |
| JP | 2016-197719 | 11/2016 |
| JP | 2017/050529 | 3/2017 |
| JP | 2017-103388 | 6/2017 |
| JP | 2017-518645 | 7/2017 |
| JP | 2017-163032 | 9/2017 |
| JP | 2017-220649 | 12/2017 |
| JP | 2017-228690 | 12/2017 |
| JP | 2021-515988 | 6/2021 |
| KR | 10-2007-0040633 | 4/2007 |
| KR | 10-2014-0090241 | 7/2014 |
| KR | 10-2016-0140447 | 12/2016 |
| KR | 10-2017-0020434 | 2/2017 |
| KR | 10-2017-0031041 | 3/2017 |
| KR | 10-2017-0054227 | 5/2017 |
| KR | 10-2017-0093718 | 8/2017 |
| KR | 10-2017-0140078 | 12/2017 |
| KR | 10-2018-0000692 | 1/2018 |

OTHER PUBLICATIONS

Office Action from U.S. Appl. No. 16/979,372 dated Nov. 18, 2021.
Final Office Action from U.S. Appl. No. 16/979,372 dated Apr. 29, 2022.
Office Action from U.S. Appl. No. 16/979,372 dated Aug. 8, 2022.
Notice of Allowance from U.S. Appl. No. 16/979,372 dated Nov. 23, 2022.
Japanese Office Action from Japanese Application No. 2020-547224 dated Feb. 28, 2023.
Office Action from U.S. Appl. No. 18/163,522 dated Aug. 3, 2023.
Japanese Notice of Allowance dated Sep. 6, 2023 from Japanese Application No. 2020-547224.

Final Office Action from U.S. Appl. No. 18/163,522 dated Mar. 13, 2024.
Korean Office Action from Korean Application No. 10-2020-7029723 dated May 20, 2024 with machine translation.
Korean Office Action from Korean Application No. 10-2024-7005584 dated May 20, 2024 with machine translation.
Korean Office Action from Korean Application No. 10-2024-7008294 dated May 20, 2024 with machine translation.
Korean Office Action from Korean Application No. 10-2024-7008297 dated May 20, 2024 with machine translation.
Korean Office Action from Korean Application No. 10-2024-7008299 dated May 20, 2024 with machine translation.
Korean Office Action from Korean Application No. 10-2024-7008302 dated May 20, 2024 with machine translation.
Chinese First Office Action from Chinese Application No. 201980019733.0 dated Jun. 4, 2024 with machine translation.
Notice of Allowance from U.S. Appl. No. 18/163,522 dated Jun. 24, 2024.
Office Action from U.S. Appl. No. 18/592,853 dated Apr. 18, 2025.
Office Action from U.S. Appl. No. 18/592,994 dated Apr. 18, 2025.
Office Action from U.S. Appl. No. 18/593,286 dated Apr. 18, 2025.
Office Action from U.S. Appl. No. 18/593,113 dated Apr. 18, 2025.
Notice of Reason for Refusal from Japanese Application No. 2024-16041 dated May 20, 2025.
Notice of Reason for Refusal from Japanese Application No. 2024-36438 dated May 20, 2025.
Notice of Reason for Refusal from Japanese Application No. 2024-36439 dated May 20, 2025.
Notice of Reason for Refusal from Japanese Application No. 2024-36440 dated May 20, 2025.
Notice of Reason for Refusal from Japanese Application No. 2024-36441 dated May 20, 2025.
Korean Office Action from Korean Application No. 10-2024-7008294 dated Apr. 30, 2025.
Korean Office Action from Korean Application No. 10-2024-7008297 dated Apr. 30, 2025.
Korean Office Action from Korean Application No. 10-2024-7008299 dated Apr. 30, 2025.
Korean Office Action from Korean Application No. 10-2024-7008302 dated Apr. 30, 2025.
Final Office Action from U.S. Appl. No. 18/592,853 dated Oct. 22, 2025.
Final Office Action from U.S. Appl. No. 18/593,286 dated Oct. 22, 2025.
Final Office Action from U.S. Appl. No. 18/593,113 dated Oct. 22, 2025.
Notice of Allowance from U.S. Appl. No. 18/592,994 dated Oct. 28, 2025.
Japanese Notice of Refusal from Japanese Application No. 2024-16041 dated Nov. 25, 2025 with Machine Translation.
Japanese Decision to Grant a Patent from Japanese Application No. 2024-36438 dated Nov. 4, 2025 with Machine Translation.
Japanese Decision to Grant a Patent from Japanese Application No. 2024-36439 dated Nov. 4, 2025 with Machine Translation.
Japanese Decision to Grant a Patent from Japanese Application No. 2024-36440 dated Nov. 12, 2025 with Machine Translation.
Japanese Decision to Grant a Patent from Japanese Application No. 2024-36441 dated Nov. 4, 2025 with Machine Translation.
Japanese Decision to Grant a Patent from Japanese Application No. 2024-016041 dated Mar. 24, 2026 with Machine Translation.
Korean Final Office Action from Korean Application No. 10-2020-7029723 dated with Machine Translation.
Korean Decision to Grant a Patent from Korean Application No. 10-2024- 7005584 dated Mar. 27, 2026 with Machine Translation.
Korean Final Office Action from Korean Application No. 10-2024-7008294 dated Mar. 27, 2026 with Machine Translation.
Korean Final Office Action from Korean Application No. 10-2024-7008297 dated Mar. 27, 2026 with Machine Translation.
Korean Final Office Action from Korean Application No. 10-2024-7008299 dated Mar. 27, 2026 with Machine Translation.
Korean Final Office Action from Korean Application No. 10-2024-7008302 dated with Machine Translation.

(56)       References Cited

OTHER PUBLICATIONS

Notice of Allowance from U.S. Appl. No. 18/593,286 dated Feb. 2, 2026.
Notice of Allowance from U.S. Appl. No. 18/592,853 dated Apr. 6, 2026.

\* cited by examiner

PLASMA ETCHING CHEMISTRIES OF HIGH ASPECT RATIO FEATURES IN DIELECTRICS

CROSS REFERENCE TO RELATED APPLICATION

This application is a continuation of U.S. application Ser. No. 18/163,522 filed on Feb. 2, 2023, which is a continuation of U.S. application Ser. No. 16/979,372 filed on Sep. 9, 2020 (U.S. Pat. No. 11,594,429), which is a 371 of international Application No. PCT/US2019/021761 filed on Mar. 12, 2019, which claims the benefit of U.S. Provisional Application No. 62/644,095, filed on Mar. 16, 2018, which is incorporated herein by reference for all purposes.

BACKGROUND

The disclosure relates to a method of forming semiconductor devices on a semiconductor wafer.

For example, in forming semiconductor devices, etch layers may be etched to form memory holes or lines or other semiconductor features. Some semiconductor devices may be formed by etching a single stack of silicon dioxide (SiO), for example, to form a capacitor in dynamic access random memory (DRAM). Other semiconductor devices may be formed by etching stacks of bilayers of alternating silicon dioxide (oxide) and silicon nitride (nitride) (ONON), or alternating silicon dioxide and polysilicon. Such stacks may be used in memory applications and three dimensional "not and" gates (3D NAND). The background description provided herein is for the purposes of generally presenting the context of the disclosure. These stacks tend to require relatively high aspect ratio (HAR) etching of the dielectrics. For high aspect ratio etches, examples of desired etch characteristics are high etch selectivity to the mask (such as an amorphous carbon mask), low sidewall etching with straight profiles, and high etch rate at the etch front. Work of the presently named inventors, to the extent it is described in this background section, as well as aspects of the description that may not otherwise qualify as prior art at the time of filing, are neither expressly nor impliedly admitted as prior art against the present disclosure.

SUMMARY

To achieve the foregoing and in accordance with the purpose of the present disclosure, a method for etching features in a stack below a patterned mask in an etch chamber is provided. The stack is cooled with a coolant with a coolant temperature below −20° C. An etch gas is flowed into the etch chamber. A plasma is generated from the etch gas. Features are selectively etched into the stack with respect to the patterned mask.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
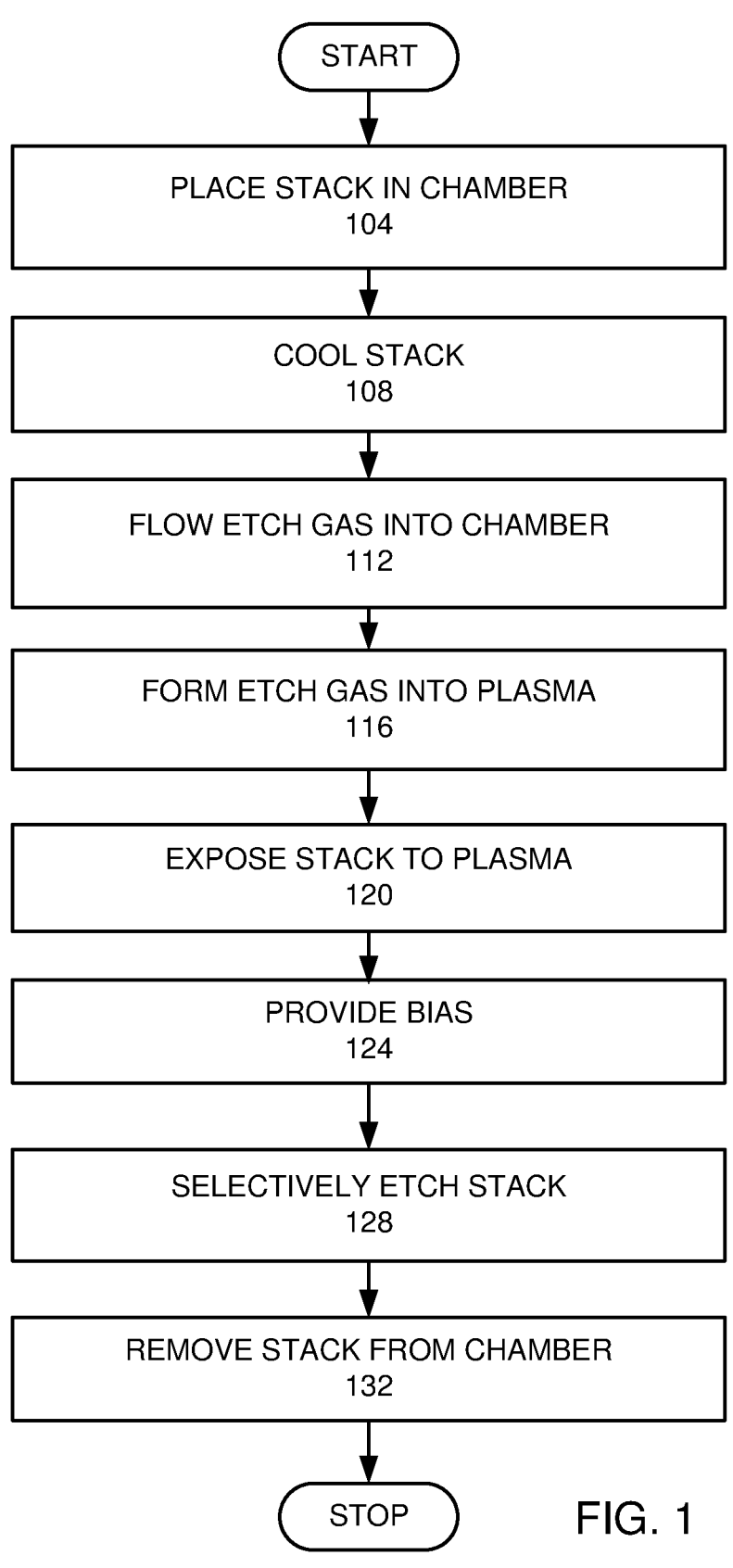
FIG. 1 is a high level flow chart of an embodiment.

FIG. 1 is a high level flow chart of an embodiment. In this embodiment, a stack is placed in an etch chamber (step 104). The stack is disposed below a patterned mask. The stack has at least one dielectric layer. The stack is cooled by a coolant with a coolant at a cryogenic temperature (step 108). An etch gas is provided by flowing the etch gas into the etch chamber (step 112). The etch gas is formed into an etch plasma (step 116). The stack is exposed to the plasma (step 120). A bias is provided to accelerate ions from the plasma to the stack (step 124). The stack is selectively etched with respect to the patterned mask by the etch plasma (step 128). The stack is removed from the etch chamber (step 132).

Etching high aspect ratio structures is also commonly required through semiconductor materials such as silicon dioxide in order to produce semiconductor devices. Etching high aspect ratios requires a directional (anisotropic) etch, as distinct from an isotropic etch. Usually, directional etching is achieved by the use of ions in the plasma that are accelerated perpendicular to the wafer surface. For example, applying a bias of 10-5000 electron volts (eV) will accelerate the ions that exist in the plasma to the wafer surface. The ions provide a plasma etching.

In the specification and claims, the word cryogenic refers to "cold" substrate temperatures. The word "cold" used in conventional etching means −20° C. or lower. The history of cryogenic etching goes back to 1988 and is most often studied on silicon materials. On silicon high aspect ratio etching, it is important to control the tendency towards chemical etching of the sidewalls in order to maintain directionality. Chemical etching is the process by which a chemical chemisorbs onto a surface to spontaneously form a new species with the surface that will desorb at a thermal surface temperature. For example, fluorine will spontaneously react with a silicon surface to form silicon tetrafluoride (SiF4) at room temperature. This is a problem in directional etching because the chemical etching is isotropic in nature—in other words, the chemicals in the plasma are isotropic and will land on the surface based on line of sight. This chemical etching can cause lateral etching and directionality of the high aspect ratio etching will be compromised. In high aspect ratio etching of silicon, this was managed by use of the Bosch process or cryogenic etching, which will suppress the chemical etch. The most common approach of etching high aspect ratio structures and silicon is using the Bosch Process, which alternates between an etching chemistry and a depositing chemistry to protect the sidewalls. This type of etch is usually done at moderate temperatures, typically between −20° C. and 100° C. The purpose of the depositing chemistries is to protect the sidewalls.

A reason for using cryogenic temperatures is that the spontaneous chemical etching of the sidewalls would be suppressed, and thus depositing chemistries used in the Bosch process would not be necessary. Such cryogenic processes were not generally pursued due to the difficulty of keeping a substrate surface at cryogenic temperatures during processing.

In literature of high aspect ratio etching of silicon, the typical chemistry used is sulfur hexafluoride ($SF_6$) and oxygen ($O_2$), where the fluorine is the reactant for removing silicon as $SiF_4$ or silicon difluorosilicon ($SiF_2$), the sulfur and oxygen offers some protection of the sidewalls that will then evaporate once the wafers are brought back to room temperature. Ion etching is the dominant etch process in cryogenic etching. While fluorocarbons are used in the depositing step in a Bosch process, fluorocarbons are not typically used at cryogenic temperatures for silicon, because silicon with carbon will form a very hard silicon carbide that hinders the etch. At the etch front, the silicon carbide hinders the etch, but eventually is broken through by the ion bombardment. Another advantage of cryogenic etching of silicon (Si) is that that the sidewall protection does not need to be very strong. Cryogenic etching of silicon can help speed up etch rates by reducing the amount of deposition needed to protect the sidewalls.

Etching of dielectrics can be different than etching silicon. For example, silicon tends to etch chemically, meaning that chemical reactions occur spontaneously to desorb silicon byproducts, such as $SiF_4$ or $SiCl_2$. While silicon nitride (SiN) can also etch chemically with nitrogen trifluoride ($NF_3$), in contrast, silicon dioxide does not typically etch spontaneously. Etching silicon dioxide is instead ion induced along with reactants to hasten desorption. In addition, dielectrics such as oxide and nitride contain silicon as well as another element, such as an oxygen or nitrogen, in the lattice. While silicon will etch spontaneously with halogens such as fluorine, chlorine, or bromine, the oxygen does not easily form stable volatile species with halogens alone. At room temperature, oxygen removal in the oxide is enhanced by the presence of Carbon to form carbon monoxide (CO) or carbon dioxide ($CO_2$) volatile compounds, or hydrogen (H) to form water ($H_2O$), or boron-chloride ($BCl_3$) to form volatile $B_xCl_yO_z$-compounds, or sulfur oxide (SO) to form sulfur dioxide ($SO_2$). For the case of nitrogen (N) then fluorine can remove N as $NF_3$, or with H as ammonia ($NH_3$). More specifically: for etching the silicon component at cryogenic temperatures, halogens, such as fluorine (F), chlorine (Cl), bromine (Br), and iodine (I) may be used for etching the silicon component. For etching the oxygen component in silicon oxide at cryogenic temperatures, carbon (C), boron (B), hydrogen (H), sulfur (S), and nitrogen are effective for etching the oxygen component. For etching the nitrogen component of silicon nitride at cryogenic temperatures H, and F may be used to etch the nitrogen component. It has also been found that at cryogenic temperatures C, H, oxygen (O), silicon (Si), F, and S may be used as passivation agents. Thus the chemicals required to etch dielectric layers at cryogenic temperatures may be different than those used for silicon.

In an example of a typical chemistry for etching dielectrics at room temperature, fluorocarbon chemistries, such as octafluorocyclobutane ($C_4F_8$) and/or hexafluoro-2-butyne ($C_4F_6$) are typically used. $C_4F_8$ and/or $C_4F_6$ fragment in the plasma to form fluorocarbons polymers that can passivate the sidewalls and protect the mask. Whereas, at the etch front, as long as the polymer is not too thick, ions incident at the etch front will use the carbon and fluorine to etch the oxide. For example, the carbon will combine with oxygen to form CO and $CO_2$. The fluorine will combine with the silicon to form $SiF_4$, $SiF_2$ volatile compounds. The sidewalls do not receive incident ions and the polymer remains to protect the sidewalls. In 3D NAND applications for etching stacks of oxide and nitride layers, a typical plasma processing chemistry would be $C_4F_8$, $C_4F_6$, $O_2$, and fluoromethane ($CH_3F$). The $C_4F_5$ and $C_4F_6$ gases fragment in the plasma to produce polymerizing fluorocarbons. The carbon and fluorine at the etch front are reactants. The $O_2$ is added as an effective knob to modulate and control the polymer to keep the top of the feature open. The $CH_3F$ helps etch the nitride by providing a H source as well as the fluorocarbon. Thus, as compared to etching silicon at room temperature, for etching of dielectrics, there is typically not only a halogen source used as a reactant, but also carbon and hydrogen sources.

However, etching at room temperature requires a tradeoff between etch rate and selectivity and/or sidewall profile. If the etch rate is high due to lean fluorocarbon polymer deposition, then the sidewalls and mask may not be sufficiently protected and there will be an induced bow on the sidewalls. On the other hand, if the fluorocarbon polymer deposition is increased to protect the sidewalls and the mask, then the etch rate is hindered and slowed. Pinch off of the deposition at the top of the feature may occur as well. Cryogenic etching provides an opportunity to break some of this trade-off in dielectric etching.

Despite voluminous research on high aspect ratio etching of silicon at cryogenic temperatures, in comparison, there has been much less research into higher aspect ratio etching of dielectrics. As the surface temperature cools down, there are four main principles that provide various embodiments with different chemistries for etching dielectrics at cryogenic temperatures.

First principle: As in the etching high aspect ratio of silicon, spontaneous chemical etching of dielectrics may also be suppressed. However, this principle differs for oxide etching as compared to silicon etching. The difference is because oxide etching does not tend to be chemically etched. Instead, oxide etching is known to be an ion induced process, since oxide etching requires ion energy in order for desorption to proceed. Etching using ion energy may provide vertical etching by deflection of ions that reach the sidewalls. Nitrogen, however, is more like silicon and can be chemically etched. Cryogenic temperatures should help reduce lateral etching for SiN. Therefore, cryogenic temperatures may help reduce chemical etching in dielectric high aspect ratio etching. However, unlike the silicon case, the reduction of chemical etching will not be the most important principle for cryogenic etching. The extent that cryogenic temperatures will be important for high aspect ratio dielectric etching results from the following: For polymer sidewall passivation, the reduction in the passivation requirement allows for a leaner fluorocarbon or fluorohydrocarbon (or combination of fluorocarbon with hydrogen) etch chemistry. A leaner etch chemistry has a lower percentage of polymerizing components, such as carbon. For example, in a non-cryogenic etch process $C_4F_6$ and $C_4F_8$ may be used in the etch gas as a passivation agent. At cryogenic temperatures, carbon tetrafluoride ($CF_4$) would be used as a passivation agent. Other examples of lean chemistry would be fluoromethane ($CHF_3$), $CH_3F$, carbon tetrachloride ($CCl_4$), trifluoroiodomethane ($CF_3I$), dibromodifluoromethane ($CBr_2F_2$), pentafluoroethane ($C_2HF_5$), $C_2F_5Br$. These chemistries could be in combination with each other or with the addition of one or more of hydrogen ($H_2$) or $O_2$, or $H_2O$, hydrogen peroxide ($H_2O_2$). Besides C-containing chemistries that etch dielectrics, other non-C containing chemistries are also known to passivate and may be effective at cryogenic temperatures, since the passivation does not have to be as strong. This could include $BCl_3$ since $BCl_3$ has passivation qualities and may be effective at cryogenic temperature. $BCl_3$ is not a traditional etchant of oxide at room temperature since boron trioxide ($B_2O_3$) blocks the etch. It is believed that the blocking may be less at cryogenic temperatures and $BCl_3$ could work as an etchant component at cryogenic temperatures. Other passivation components may be chromyl chloride ($CrO_2Cl_2$), silicon tetrachloride ($SiCl_4$), thionyl chloride ($SOCl_2$), dichlorotitanium ($TiCl_2$), trichlorotitanium ($TiCl_3$), and phosgene ($CoCl_2$). The leaner chemistry in this example has a lower carbon to fluorine ratio.

The second principle: As the surface temperature is lowered, the sticking coefficient increases. The sticking coefficient is a measure of how long a molecule will physisorb to the surface before entering the gas phase again. In other words, at colder temperatures, a molecule will stick to the surface longer according to the Arrhenius rate law, such that the sticking time is inversely proportional to the surface temperature. This temperature dependence should have an even more pronounced effect at cryogenic temperatures. The consequence of this temperature dependence of the sticking coefficient is very important in determining where and how much reactant and inhibitor (i.e., deposition) occurs in different places on the feature. Specifically, the rate of deposition of fluorocarbon polymer depends strongly on the sticking coefficient. Fluorocarbon polymer deposition is facilitated by $C_xF_y$ species in the plasma that are prone to cross-linking. Roughly speaking, the larger the species and the more carbon content in the species, the more likely they are to form a polymer. Among the fragments formed by $C_4F_6$ gas in the plasma, molecules or ions such as $C_4F_6$, $C_4F_5$, tetrafluoroallene ($C_3F_4$), 1,2,3,3,3-pentafluoroprop-1-ene ($C_3F_5$), trifluorovinyl ($C_2F_3$), and $C_3F_2$ will tend to cross-link and form a polymer. The lower the temperature, the longer these molecules stick to the surface, increasing the deposition rate. Also, a lower temperature means that the sticking occurs mostly at the top of the feature. The polymer will accumulate at the opening and may not make it down along the sidewalls at cryogenic temperatures.

One consequence of the second principle is that the gases for cryogenic etching of dielectrics shall be chosen to be less polymerizing. In an embodiment, the gas mixtures contain carbon. For gases that contain carbon, this principle points to $CF_4$ as an example. $CF_4$ is not a typical gas for dielectric etching at high aspect ratios. However, at cryogenic temperatures $CF_4$ may work just fine because $CF_4$ has a leaner ratio of C:F and is less likely to clog the top of the feature. At the same time, the use of $CF_4$ should offer some level of protection for the sidewalls. Another example of a leaner chemistry is using $CHF_3$ for oxide etching or $CHF_3$ and $N_2$ for nitride etching. Another example may include $CF_4$ and $N_2$ for etching nitride. Also, $CH_2F_2$ and $CH_3F$ and $CCl_4$ and carbonyl sulfide (COS), CO, $CO_2$, methylene chloride ($CH_2Cl_2$), methane ($CH_4$), $CF_3I$, chloroform ($CHCl_3$) may be used as etchants. One can add or combine other gases such as N-containing gases, such as $NH_3$, hydrogen sulfide ($H_2S$), silane ($SiH_4$), disilane ($SiH_6$), propene ($C_3H_6$), nitrogen oxide ($N_2O$), $H_2O_2$, nitric acid ($HNO_3$), etc. to any of these gas mixtures in order to promote etching in nitrides, or $O_2$ to modulate the deposition that does occur. So for example, some possible gas mixture recipes may be a mixture of $CF_4$, $O_2$, and $N_2$ or a mixture of $CF_4$, $CHF_3$, and $O_2$, or a mixture of $CF_4$, COS, and $N_2$, or a mixture of $CF_4$ and CO, or a mixture of $CF_4$ and $CH_4$ and all other permutations. Along these lines, since both oxygen and nitrogen may be desired, it may be possible to use a nontraditional reactant for etching dielectrics, such as $H_2O$ for example in the combination of $CF_4$ and $H_2O$. Some hardware modifications may be needed to accommodate the input of $H_2O$ since $H_2O$ is not normally a gas at room temperature. Any of these combinations mentioned above may not normally be used to etch high aspect ratio dielectric structures because they are not sufficiently polymerizing at room temperature. However, at cryogenic temperatures, even these lean chemistries may offer some protection to the sidewalls, as they are more likely to condense to the surfaces at cryogenic temperatures. Therefore such chemistries that usually are thought of as etchants may also deposit or at least passivate the sidewalls at cryogenic temperatures.

Further regarding the second principle: The previous paragraph focused on leaner chemistries that contain carbon. But since at cryogenic temperatures gases are more likely to protect the sidewalls even if the gases do not as passivation have carbon content, at cryogenic temperatures there is now another class of chemicals that may be used for sidewall passivation that is not normally used at room temperature. Since not as much deposition will be required, silicon with oxygen and/or nitrogen may be etched by using the following halogen containing chemical combinations such as: a mixture of $BCl_3$ and chlorine ($Cl_2$), or HBr, or a mixture of $Cl_2$ and $N_2$, or $CF_4$, or $Br_2$, or COS, or $SiH_4$ as an H source for silicon nitride etching. In some embodiments, iodine can be used as a halogen. Normally, $BCl_3$ is not used for dielectric etching at room temperature, since $BCl_3$ does not readily etch oxide at room temperature since $BCl_3$ forms a surface film of SiOBCl that blocks etching. However, at lower temperatures, it has been found that $BCl_3$ deposition actually decreases at lower temperatures. In this case, the $BCl_3$ etching is not due to the increased sticking coefficient, but because of a slower reaction. As a result, $BCl_3$ would normally deposit at room temperature, but etches at cryogenic temperatures to produce a volatile $B_xCl_yO_2$ species. This would be another example of chemistries that may be suitable for etching at cryogenic temperatures, but not at room temperature. Other chemicals in the class like $BCl_3$ might include $MgCl_2$, $PdCl_2$, and $TiCl_3$.

The second principle provides another consequence. An increase sticking coefficient at lower temperatures is described above. This means that molecules will tend to stick to the tops of features before making their way down the sidewalls or to the etch front of the feature. However, if a molecule is small enough or does not deposit it can still make it to the bottom of the feature. Specifically, for fluorocarbon deposition, it is known that the etching species (ions or molecules) tends to be F, carbon fluoride (CF), difluoromethane ($CF_2$). These species are small enough that they do not polymerize and instead are more likely to etch if they reach a surface. It is known in an inverse reactive ion etch (RIE) lag phenomenon, where higher aspect ratio features etch faster than smaller aspect ratio features, the high aspect ratio acts as a sort of filter for small particles. The inverse RIE is caused by only the small particles making it to the bottom of the features. The inverse RIE can help selectivity both increasing the etch rate at the bottom due to less deposition, and protecting the mask at the top where the sticking of the larger species occurs and forms a deposition film.

This implication of the second principle indicates that it would be beneficial for high aspect ratio dielectric etching to use gases with a high fluorine source. The $C_4F_6$ and $C_4F_5$ typically used at room temperature are not a good source of F, because very small concentrations of these gases are fragmented into the small particles of F, CF, or $CF_2$. Instead, at cryogenic temperatures, the large species in $C_4F_6$ and $C_4F_5$ are more likely to get stuck at the top of the feature and block the etch, without any reactants getting to the bottom. The types of gases that do fragment into F (radical) source would include those readily available in labs: $CF_4$, $SF_6$, $NF_3$, $XeF_2$, tungsten hexafluoride ($WF_6$), $SiF_4$, tantalum pentafluoride ($TaF_5$), iodine heptafluoride ($IF_7$), hydrogen fluoride (HF) (vapor or produced inside the plasma indirectly). More generally, Metals charged +5 or higher, such as metal halides, are more volatile and could be delivered to the surface via plasma. Thus, many pentafluoride chemistries tend to be gases and could be good candidates for F-generating plasmas. This class of pentafluoride gases would additionally include chlorine pentafluoride ($ClF_5$), bromine pentafluoride ($BrF_5$), arsenic pentafluoride ($AsF_5$), nitrogen pentafluoride ($NF_5$), phosphorus pentafluoride ($PF_5$), niobium pentafluoride ($NbF_5$), bismuth pentafluoride ($BiF_5$), and uranium ($UF_5$). An advantage of some of these, $BiF_5$, will also form polymers that can protect the sidewalls as well. This approach might also work with chlorine containing species for the same reasons. Such as $SiCl_2$, $CrO_2Cl_2$, $SiCl_4$, tantalum tetrachloride ($TaCl_4$), hafnium tetrachloride ($HfCl_4$), titanium chloride ($TiCl_3$ (l)), titanium tetrachloride ($TiCl_4$ (l)), cobalt chloride $CoCl_2$(l)) are other options.

Some of these gases mentioned are readily available, yet rarely used in dielectric or any etching platform because they are more usually found on deposition platforms, such as $WF_6$, $TiCl_3$, and $TiCl_2$. In fact, some of these are more known in etch as byproducts rather than etching species. For example, $WF_6$ is a byproduct of etching tungsten (W) in $SF_6$ or $CF_4$ plasma. And $TiCl_4$ and $TaCl_4$ and $HfCl_4$ are byproducts of etching titanium (Ti), tantalum (Ta), titanium nitride (TiN), and tantalum nitride (TaN) or hafnium (Hf) in $Cl_2$ or $BCl_3$ plasmas. Various embodiments use, such gases like $CF_4$, $SF_6$, $NF_3$, $XeF_2$, $WF_6$, $SiF_4$, $TaF_5$, $IF_7$, HF, $ClF_5$, $BrF_5$, $AsF_5$, $NF_5$, $PF_5$, $NbF_5$, $BiF_5$, $UF_5$, $WF_6$, $TiCl_3$, and $TiCl_2$ to provide the high-F or Cl species for etching dielectrics. Cl species may be less effective. Specifically, $WF_6$, $TaCl_4$, and $HfCl_4$ may provide an additional advantage because W, Ta, Hf, niobium (Nb), rhenium (Re) are refractory metals, known for being very hard. As mentioned earlier, the mask tends to be C. If hard species are doped into the C, the mask can be strengthened. So, for example, W doped C is harder than amorphous C. Thus, if an etch process uses $WF_6$, $TaCl_4$, or $HfCl_4$, then W, Ta, or Hf is implanted into the mask. The implantation should have the added benefit of hardening the mask and increasing selectivity. Since F is likely more effective than Cl or Br. Preferred etch gases are $WF_6$ or $TaF_5$. $WF_6$ or TaF are both gases at room temperature and are easier to insert into a plasma. Besides refractory metals, both B and C are also very hard and can harden or reharden the amorphous carbon mask. Therefore, $CF_4$, boron trifluoride ($BF_3$), and boron tribromide ($BBr_3$) may be used as etchant component gases in various embodiments. For fluorine producing etch gases, preferred etch gases provide F radicals and are rather large molecules. So, hexafluorines would be favored over tetrafluorines. For example, $WF_6$ and $TaF_5$ are favored over $SiCl_2$. If these gases are able to remove O. These gases can be combined with a C- or H-containing gas.

As previously mentioned some of these gases are used in deposition processes. These gases may deposit on the top of the feature and not at the etch front on the bottom of the feature. In an embodiment, the etch may be enhanced further by purposely depositing on tops of the features. For example, using an etch gas of $WF_6$ or $TiCl_4$ or $TaF_5$ could deposit (rather than implant/dope) a metal onto the mask at the top of the features, as done in ALD, using a chemistry of $WF_6$ and $H_2$ or a chemistry of $WF_6$ and $SiH_4$, for example. It is believed that only the F and H will reach the bottom of the feature and will etch, while deposition sticks and deposits on the top of the feature. This is also a way to provide H that may help etch O and N, as $H_2O$ or $NH_3$. In another example, Ta is deposited using $TaF_5$. Since Ta is a very hard material, Ta could be used to harden the mask. Ti may be deposited, using and $TiCl_4$ with an appropriate precursor.

A third principle is as follows: Although etching $SiO_2$ at room temperature does not usually work with F alone and also needs C, B, or H, an embodiment etches $SiO_2$ at cryogenic temperatures with F alone, not needing C, B, or H. The reason for needing C, B, or H in order for F to etch $SiO_2$ at room temperature is that fluoroniumdiolate ($FO_2$) is volatile at room temperature (boiling point $-144°$ C.). Oxygen difluoride ($OF_2$) decomposes to oxygen and fluorine via a radical mechanism. In plasma, this might be happening even faster. So, the $OF_2$ is not stable. An embodiment uses cryogenic temperatures to provide a stable $OF_2$ vapor. Then at cryogenic temperatures, $SiO_2$ is etched with the F containing gases without adding C, B, H additives. Also, it is known that underexposure of plasma $O_2$ gets preferentially sputtered away. Then, a surface becomes more metal-like. So, an embodiment etches $SiO_2$ with a component with a fluorine containing etch gas, such as $SF_6$, at cryogenic temperatures, when normally such a gas is reserved for silicon only and is not able to etch $SiO_2$.

The fourth principle is as follows: In another approach, it has been found that an etchant at non-cryogenic temperatures has been unexpectedly found to be a passivation component agent at cryogenic temperatures. For example, $SF_6$ is used as an etchant at non-cryogenic processes. However, $SF_6$ has been found to act like a passivation agent and not an etchant at cryogenic temperatures. Other molecules provide passivation at cryogenic temperatures that do not provide passivation at non-cryogenic temperatures. For example, as mentioned above, water may be a passivation component at cryogenic temperatures. Amines and $SO_2$ may also be used as passivation agents at cryogenic temperatures. It has been found that $CO_2$ may be used as a passivation agent at cryogenic temperatures. $CO_2$ may be a desirable passivation agent because $CO_2$ would be less likely to form crystals, but instead, be in more of a slurry configuration. Other passivation agents at cryogenic temperatures may be COS, CO, S from $SF_6$, or $SiF_4$.

Other embodiments provide an atomic layer etch (ALE) or atomic layer deposition (ALD) at cryogenic temperatures. In an embodiment of a cryogenic ALE, chemical reactants are supplied in step A as an atomic layer etch gas, where step B supplies thermal or ion energy or another type of energy to desorb the byproduct. Specifically, in step A in ALE, cryogenic temperatures are used to suppress any etching, as any etching that occurs in step A is nonideal and undesirable. While many reactants can absorb but not etch at room temperature. There are quite a number of reactants that will spontaneously etch at room temperature. The best-known case of this is silicon in the presence of fluorine will spontaneously form $SiF_4$ at room temperatures. By using cryogenic temperatures, this reaction is suppressed. Various embodiments broaden this approach. In an embodiment, tin oxide (SnO) etches spontaneously with $H_2$ at room temperature, making it very difficult to turn this into an ALE process at room temperature. However, by going to cryogenic temperatures, estimated at −70° C., it is believed that this reaction is suppressed, allowing a successful ALE process.

ALE may be advantageous for HAR. In ALE, in an embodiment, the second step provides only argon. It is known that argon only can actually strengthen an amorphous carbon film into something more diamond like. So, the intermittent use of an argon only plasma to strengthen the mask may be used in a high aspect ratio etch process. Such a process may also be used in ALD in an embodiment.

In addition, it has been found that harder materials are easier to etch using ALE. By performing ALE at cryogenic temperatures, the cryogenic temperatures make the material being etched effectively a harder material without changing the material's surface binding energy. This provides an easier ALE on the material. In an embodiment, the chemical reaction step A is performed at cryogenic temperatures to provide a modified layer and the use of ion energy for activation in step B is also done at cryogenic temperatures to activate the modified layer. In another embodiment, the chemical reaction step A is performed at cryogenic temperatures and the activation step B is done at higher temperatures (with ions) or even thermally, where heat is used as the energy source. In an embodiment, the substrate is moved between two different chambers for each step, so that step A is performed in a chamber at cryogenic temperatures and step B is performed in a chamber at noncryogenic temperatures. In another embodiment, step A is performed at cryogenic temperatures and the activation step B is performed under a heat lamp, where the heat lamp provides thermal energy to a small volume where the thermal energy is needed.

In embodiments where cryogenic temperatures are used for ALD, a first precursor, provided as an atomic layer deposition gas, may be deposited at cryogenic temperatures for step A and a second precursor may be deposited at cryogenic temperatures for step B. Usually, this is not done at cryogenic temperatures, because the adsorption of the precursor usually requires elevated temperatures. However, if plasma is used to make the precursor more reactive, then cryogenic temperatures could be used to avoid other thermally activated surface reactions. A problem would be potential condensation of the precursor onto the substrate. The condensation would not be self-limiting. Therefore, the temperature window may or may not be compatible with cryogenic temperatures. The likelihood that the window is compatible with cryogenic temperatures is increased when a plasma is used.

Example

Figure 2:
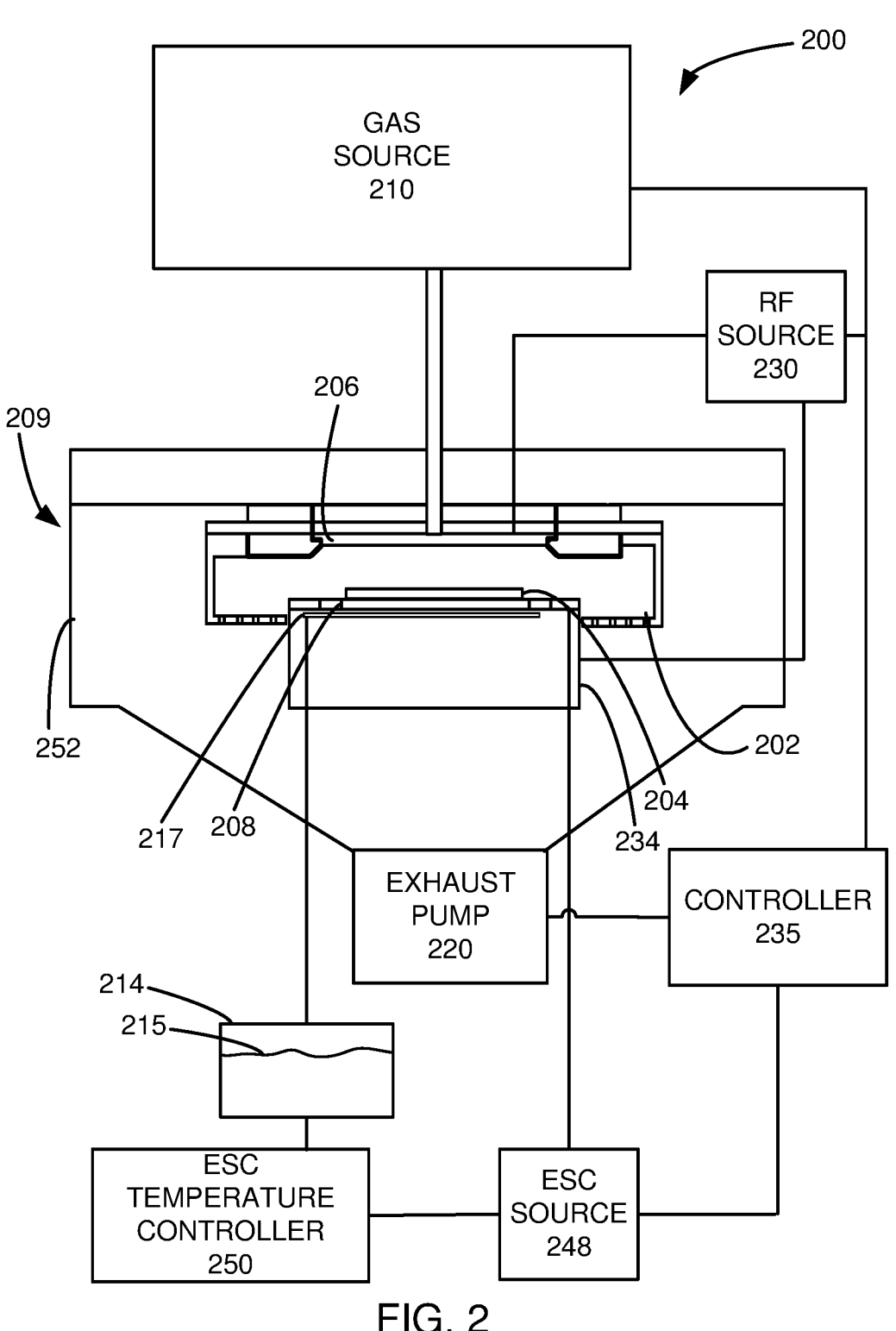
FIG. 2 is a schematic view of an etch chamber that may be used in an embodiment.

FIG. 2 is a schematic view of an etch reactor 200 that may be used in an embodiment. In one or more embodiments, an etch reactor 200 comprises a gas distribution plate 206 providing a gas inlet and an electrostatic chuck (ESC) 208, within an etch chamber 209, enclosed by a chamber wall 252. Within the etch chamber 209, a stack 204 is positioned over the ESC 208. The ESC 208 may provide a bias from the ESC source 248. An etch gas source 210 is connected to the etch chamber 209 through the gas distribution plate 206. An ESC temperature controller 250 is connected to a chiller 214, which chills a coolant 215. In this embodiment, the chiller 214 provides the coolant 215 to channels 217 in or near the ESC 208. A radio frequency (RF) source 230 provides RF power to a lower electrode and/or an upper electrode, which in this embodiment are the ESC 208 and the gas distribution plate 206, respectively. In an exemplary embodiment, 400 kilohertz (kHz), 60 megahertz (MHz), and optionally, 2 MHZ, 27 MHz power sources make up the RF source 230 and the ESC source 248. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 235 is controllably connected to the RF source 230, the ESC source 248, an exhaust pump 220, and the etch gas source 210. An example of such an etch chamber is the Flex™ etch system manufactured by Lam Research Corporation of Fremont, CA. The process chamber can be a CCP (capacitively coupled plasma) reactor or an ICP (inductively coupled plasma) reactor.

Figure 3:
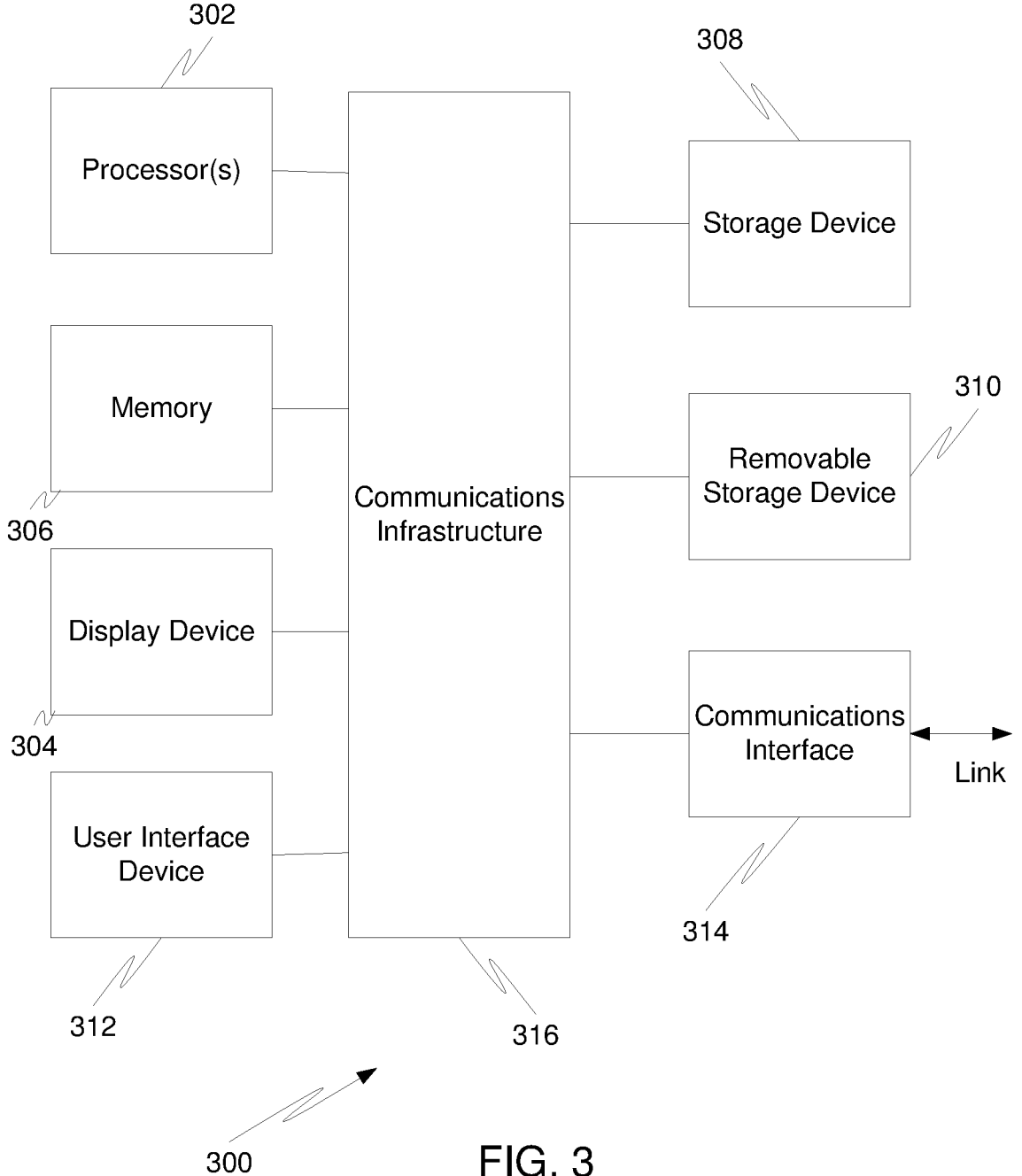
FIG. 3 is a schematic view of a computer system that may be used in practicing an embodiment.

FIG. 3 is a high level block diagram showing a computer system 300, which is suitable for implementing the controller 235 used in embodiments. The computer system 300 may have many physical forms ranging from an integrated circuit, a printed circuit board, and a small handheld device up to a huge supercomputer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communications interface 314 (e.g., wireless network interface). The communications interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communications link that carries signals and may be implemented using wire or cable, fiber optics, a phone line, a cellular phone link, a radio frequency link, and/or other communications channels. With such a communications interface 314, it is contemplated that the one or more processors 302 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that is executed by a computer using an interpreter. Computer readable media may also be computer code transmitted by a computer data signal embodied in a carrier wave and representing a sequence of instructions that are executable by a processor.

Figures 4A, 4B:
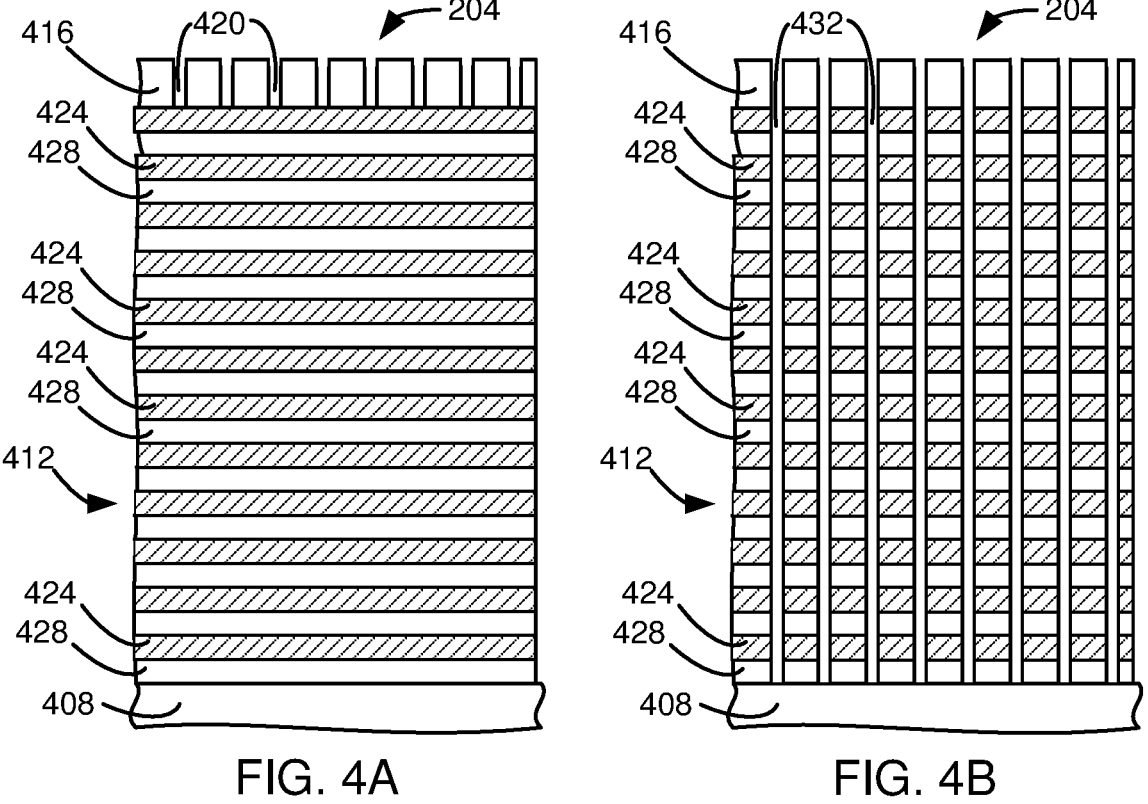
FIGS. 4A-B are schematic cross-sectional views of a stack processed according to an embodiment.

In an exemplary embodiment, a stack is placed in an etch chamber (step 104). FIG. 4A is a schematic cross-sectional view of a stack 204. In this embodiment, the stack 204 comprises a substrate 408 under a plurality of bilayers 412 disposed below a patterned mask 416. In this example, one or more layers may be disposed between the substrate 408 and the plurality of bilayers 412 or the plurality of bilayers 412 and the patterned mask 416. In this example, the patterned mask 416 is a carbon containing patterned mask, such as amorphous carbon. This embodiment does not have a silicon containing mask above the plurality of bilayers 412 or above the patterned mask 416. In this example, the patterned mask pattern provides mask features 420 for high aspect ratio contacts. In some embodiments, the mask features 420 are formed before the stack 204 is placed in the etch chamber 209. In other embodiments, the mask features 420 are formed while the stack 204 is in the etch chamber 209. In this embodiment, each bilayer 412 is a bilayer of a layer of silicon oxide 424 and a layer of silicon nitride 428.

After the stack 204 has been placed into the etch chamber 209, the stack 204 is cooled using a coolant with a coolant temperature below −20° C. (step 108). An etch gas is flowed into the etch chamber 209 (step 112). In this example, the etch gas is $CF_4$. In this example, a pressure of 5 to 60 mTorr is provided. The etch gas is formed into an etch plasma (step 116). This may be accomplished by providing an excitation RF with a frequency of 60 MHz at 200 to 8000 watts. The stack 204 is exposed to the plasma (step 120). A bias with a magnitude of at least about 400 volts is provided (step 124). In this embodiment, the high bias is provided by providing an RF with a frequency of 400 kHz at 2 kW to 18 kW by the ESC source 248 to the ESC 208. The bias causes ions to be accelerated to the stack 204 causing the selective etching of high aspect ratio etch features into the plurality of bilayers 412 with respect to the carbon containing patterned mask 416 (step 128). The plasma is maintained for 180 to 3600 seconds. The etch is able to etch both the silicon oxide 424 and silicon nitride 428 layers. After the etch is complete other processes may be performed on the stack 204. The stack 204 is then removed from the etch chamber 209 (step 132).

FIG. 4B is a cross-sectional view of the stack 204 after the contacts 432 have been etched. The contacts 432 are high aspect ratio contacts. Preferably, the high aspect ratio contacts 432 have a height to critical dimension (CD) width aspect ratio of greater than 20:1, where in this embodiment, the CD is measured at the top of the feature. Other embodiments may have a height to a width aspect ratio of greater than 50:1. The etch process is able to selectively etch the silicon oxide 424 and silicon nitride 428 layers with respect to amorphous carbon with a selectivity of greater than 5:1 while etching high aspect ratio features. The resulting features also have reduced bowing, striation, distorting, capping, and tapering. In addition, this embodiment allows the use of a carbon containing patterned mask, such as amorphous carbon, without requiring a silicon containing mask such as polysilicon. The elimination of a requirement for a silicon containing mask reduces costs and defects.

Previous processes that use an etch, where the stack is processed at a temperature above −20° C., relied on a fluorocarbon chemistry to etch and provide sidewall protection. Such a process resulted in a mask to silicon oxide and silicon nitride etch selectivity of less than 5:1. Sidewall protection for previous processes was provided by polymer deposition. The polymer deposition was controlled by the concentration of carbon, where a higher concentration of carbon increases sidewall deposition, and by oxygen, where a higher concentration of oxygen consumes the deposited polymer. The higher concentration of oxygen also increased the consumption of the mask. Some previous processes used a silicon containing mask. The above embodiment increases the etch rate and improves contact shape/striation compared to a conventional approach.

In some embodiments, to provide a coolant 215 with a coolant temperature below −20° C. to the stack 204, the coolant is cooled to a coolant temperature below −60° C. In other embodiments, the coolant 215 is cooled to a coolant temperature between −30° C. to −200° C. In other embodiments, the coolant 215 is cooled to a coolant temperature between about −40° C. to about −200° C. In some embodiments, the stack is cooled to a temperature between −30° C. to −200° C. In the specification and claims, performing the etch at cryogenic temperatures is defined as performing the etch with a coolant at a temperature below −20° C. More preferably, cryogenic temperatures use a coolant at temperatures between −20° C. and −150° C. More preferably, cryogenic temperatures use a coolant at temperatures below −60° C. Generally, performing an etch at cryogenic temperatures has a coolant at one of the above ranges. In some embodiments, an operation at a cryogenic temperature cools the stack 204 to a temperature below −20° C. at some time during the operation. In other embodiments, an operation at a cryogenic temperature keeps the stack 204 at a temperature below −20° C. during the entire operation.

In some embodiments, the etch gas further comprises one or more of a free fluorine providing component, a hydrogen containing component, a hydrocarbon containing component, a fluorocarbon containing component, and an iodine containing component. A free fluorine providing component is defined as a component that will normally break down in plasma to provide free-fluorine, such as $NF_3$ and sulfur hexafluoride ($SF_6$). Hydrogen containing components are preferably $H_2$, $CH_3F$, and difluoromethane ($CH_2F_2$).

The ONON stack may be etched to form features, such as contact holes, lines, or trenches in making a 3D NAND memory device. Other embodiments may etch contact holes to be used in MOC and MOA, which are first metal contacts used to control 3D NAND junctions. Other embodiments may be used for dynamic random access memory (DRAM) Capacitor etching. Other embodiments may be used to etch silicon oxide and polysilicon bilayers (OPOP). Embodiments provide an etch depth of greater than 20 microns. In other embodiments, the etch depth is greater than 3 microns. Such embodiments allow the etching of at least 48 bilayers of silicon oxide and silicon nitride in a single etch step using a single amorphous carbon mask with a thickness of less than 1 microns. In addition, the contacts preferably have a etch depth to neck aspect ratio of greater than 30:1.

In some embodiments, the stack may be a single layer of silicon oxide or silicon nitride. In other embodiments, the stack may be a single layer or multiple layers of other silicon containing materials.

The above embodiment used a bias with a magnitude of at least 400 volts. It has been found that a bias with a magnitude of at least 1000 volts would provide an improved etch. It is believed that a bias with a magnitude of at least 2000 volts would provide a further improved etch. Without being bound by theory it is believed that the higher bias would allow for a higher aspect ratio etch while taking advantage of other features, which allows for the use of an amorphous carbon mask and reducing striation and bowing.

In some embodiments, liquid nitrogen is used as a coolant that is flowed through the chuck or bottom electrode to provide cooling. In other embodiments, liquid Vertel Sinera™ manufactured by DuPont Corporation of Wilmington, DE may be used as the coolant.

Bowing is normally a problem in the etching of contacts, where the features are cylindrical and may have a circular cross-section. Therefore, in various embodiments, the features are contacts with a circular cross-section. In other embodiments, the features may have other cross-sections, such as ovals, squares, and other polygons. By reducing bowing, the etched features have more of a cylindrical shape. In other embodiments, the features may be lines, steps, or other shapes. Other embodiments may have one or more of a silicon containing mask or a metal containing mask. Halogens in various embodiments are preferably fluorine, bromine, or iodine.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for etching comprising:
   a) supporting a substrate on a chuck in a chamber of a plasma treatment system, the substrate including a silicon containing stack, and the chuck having a lower electrode;
   b) cooling the substrate to a temperature below −20° C.;
   c) providing a halogen containing gas;
   d) providing a phosphorus containing gas; and
   e) generating a plasma from the halogen containing gas and the phosphorus containing gas wherein the plasma modifies the silicon containing stack providing a modified layer;
   f) activating the modified layer of the stack; and
   g) etching features in the silicon containing stack.

2. The method, as recited in claim 1, further comprising providing a bias.

3. The method, as recited in claim 1, wherein the generating the plasma from the halogen containing gas and phosphorus containing gas into a plasma comprises providing RF power.

4. The method, as recited in claim 1, wherein the phosphorus containing gas comprises phosphorus pentafluoride ($PF_5$).

5. The method, as recited in claim 1, wherein the halogen containing gas comprises a free fluorine providing component.

6. The method, as recited in claim 1, further comprising providing one or more of a hydrogen containing component, a hydrocarbon containing component, a fluorocarbon containing component, and an iodine containing component.

7. The method, as recited in claim 1, further comprising providing oxygen gas.

8. The method, as recited in claim 1, further comprising providing a bias with a magnitude of at least 400 volts.

9. The method, as recited in claim 1, wherein the substrate comprises at least two different silicon containing layers.

10. The method, as recited in claim 9, wherein the at least two different silicon containing layers comprise a silicon oxide layer and a silicon nitride layer.

11. The method, as recited in claim 9, wherein the at least two different silicon containing layers comprise a silicon oxide layer and a polysilicon layer.

12. A method for etching comprising:
   a) supporting a substrate on a chuck in a chamber of a plasma treatment system, the substrate including a silicon containing stack, and the chuck having a lower electrode;
   b) providing a halogen containing gas;
   c) providing a phosphorus containing gas; and
   f) providing RF power to generate a plasma from the halogen containing gas and the phosphorus containing gas wherein the plasma modifies the silicon containing stack providing a modified layer;
   g) activating the modified layer of the stack; and
   h) etching features in the silicon containing stack.

13. The method, as recited in claim 12, further comprising providing a bias.

14. The method, as recited in claim 12, wherein the phosphorus containing gas comprises phosphorus pentafluoride ($PF_5$).

15. The method, as recited in claim 12, further comprising cooling the substrate to a temperature below −20° C.

16. The method, as recited in claim 12, wherein the halogen containing gas comprises a free fluorine providing component.

17. The method, as recited in claim 12, further comprising providing one or more of a hydrogen containing component, a hydrocarbon containing component, a fluorocarbon containing component, and an iodine containing component.

18. The method, as recited in claim 12, further comprising providing oxygen gas.

19. The method, as recited in claim 12, further comprising providing a bias with a magnitude of at least 400 volts.

20. The method, as recited in claim 12, wherein the substrate comprises at least two different silicon containing layers.

* * * * *